US012561888B2

(12) United States Patent　　　　(10) Patent No.:　US 12,561,888 B2

Laudereau et al.　　　　　　　　(45) **Date of Patent:　*Feb. 24, 2026**

---

(54) METHOD FOR SIMULATING THE EFFECTS OF THE OPTICAL QUALITY OF WINDSHIELD

(71) Applicant: SAINT-GOBAIN SEKURIT FRANCE, Thourotte (FR)

(72) Inventors: Jean-Baptiste Laudereau, Paris (FR); Yuliya Karanouskaya, Knonau (CH); Tatiana Severin-Fabiani, Cachan (FR); Nicolas Mielec, Paris (FR)

(73) Assignee: SAINT-GOBAIN SEKURIT FRANCE, Thourotte (FR)

( * ) Notice: Subject to any disclaimer, the term of this patent is extended or adjusted under 35 U.S.C. 154(b) by 377 days.

This patent is subject to a terminal disclaimer.

(21) Appl. No.: 18/248,306

(22) PCT Filed: Sep. 28, 2021

(86) PCT No.: PCT/EP2021/076685

§ 371 (c)(1),
(2) Date: Apr. 7, 2023

(87) PCT Pub. No.: WO2022/073808

PCT Pub. Date: Apr. 14, 2022

(65) Prior Publication Data

US 2023/0386187 A1　　Nov. 30, 2023

(30) Foreign Application Priority Data

Oct. 8, 2020　(EP) ..................................... 20315428

(51) Int. Cl.
　*G06T 15/06*　　(2011.01)
　*G06F 30/27*　　(2020.01)
　(Continued)

(52) U.S. Cl.
　CPC .............. *G06T 15/06* (2013.01); *G06F 30/27* (2020.01); *G06T 5/80* (2024.01); *G06T 7/0002* (2013.01);
　(Continued)

(58) Field of Classification Search
　CPC ......... G06T 15/06; G06T 5/80; G06T 7/0002; G06T 15/04; G06T 15/20; G06T 15/506;
　(Continued)

(56) References Cited

U.S. PATENT DOCUMENTS

| | | | |
|---|---|---|---|
| 2010/0002071 A1* | 1/2010 | Ahiska ................... | G06V 20/52 |
| | | | 348/240.99 |
| 2012/0242724 A1* | 9/2012 | Kurozuka .............. | B60K 35/28 |
| | | | 345/697 |

(Continued)

FOREIGN PATENT DOCUMENTS

| | | | |
|---|---|---|---|
| CN | 113240592 | * 8/2021 | .............. G06T 5/80 |
| EP | 2 381 416 A1 | 10/2011 | |

(Continued)

OTHER PUBLICATIONS

International Search Report as issued in International Patent Application No. PCT/EP2021/076685, dated Dec. 20, 2021.

*Primary Examiner* — Phuc N Doan

(74) *Attorney, Agent, or Firm* — Pillsbury Winthrop Shaw Pittman LLP

(57) ABSTRACT

A method for simulating the effects of the optical quality of windshield onto the image recording quality of a digital image recording device, in particular a digital image recording device for an advanced or automated driver-assistance system. The method is based on a combination of an adapted stochastic ray tracing method and of an adapted machine learning method to simulate the effects of the optical distortions of a windshield on the image recording quality of a (Continued)

digital image recording device. The simulation is performed from a measured optical quality function of the windshields related to those optical distortions.

20 Claims, 4 Drawing Sheets

(51) Int. Cl.

| | |
|---|---|
| *G06T 5/80* | (2024.01) |
| *G06T 7/00* | (2017.01) |
| *G06T 15/04* | (2011.01) |
| *G06T 15/20* | (2011.01) |
| *G06T 15/50* | (2011.01) |
| *G06V 10/776* | (2022.01) |
| *G06V 20/56* | (2022.01) |
| *G06V 20/58* | (2022.01) |

(52) U.S. Cl.

CPC .............. *G06T 15/04* (2013.01); *G06T 15/20* (2013.01); *G06T 15/506* (2013.01); *G06V 10/776* (2022.01); *G06V 20/56* (2022.01); *G06V 20/58* (2022.01); *G06T 2207/20081* (2013.01)

(58) Field of Classification Search

CPC .......... G06T 2207/20081; G06F 30/27; G06V 20/58; G06V 10/776; G06V 20/56

See application file for complete search history.

(56) References Cited

U.S. PATENT DOCUMENTS

| | | | | |
|---|---|---|---|---|
| 2017/0169612 A1* | 6/2017 | Cashen | .................. | B60K 35/60 |
| 2017/0334759 A1* | 11/2017 | Yamato | .................. | C03B 18/18 |

FOREIGN PATENT DOCUMENTS

| | | | | |
|---|---|---|---|---|
| EP | 3 293 701 A1 | | 3/2018 | |
| FR | FR 3 032 820 A1 | | 8/2016 | |
| KR | 101619392 | * | 5/2016 | ............ G02B 27/01 |
| WO | WO 2020/164841 A1 | | 8/2020 | |

* cited by examiner

METHOD FOR SIMULATING THE EFFECTS OF THE OPTICAL QUALITY OF WINDSHIELD

CROSS-REFERENCE TO RELATED APPLICATIONS

This application is the U.S. National Stage of PCT/EP2021/076685, filed Sep. 28, 2021, which in turn claims priority to European patent application number 20315428.1 filed Oct. 8, 2020. The content of these applications are incorporated herein by reference in their entireties.

TECHNICAL FIELD

The disclosure relates to a method for simulating the effects of the optical quality of windshield onto the image recording quality of a digital image recording device, in particular a digital image recording device for an advanced or automated driver-assistance system.

BACKGROUND ART

Advanced/automated driver-assistance systems (ADAS) help drivers in controlling their vehicles to improve their safety and that of the outside surrounding environment. ADAS are on-board systems which are able to provide real-time information on the state of road traffic and/or on the state of the vehicle's mechanical and/or electrical equipment and components, assess the driver's state of fatigue or distraction, detect and anticipate possible threats from the vehicle's external environment, or help the driver perform certain difficult manoeuvres.

Outstanding functions of current ADAS are those which are now mandatory to fulfil the Euro NCAP 5* requirements, such as adaptive cruise control, lane keeping, emergency braking, and more advanced functions such as traffic signs detection, or anti-collision.

To perform these functions, ADAS integrates numerous devices and/or sensors to collect data on the driver, the vehicle and/or their environment. In particular, they embed one or more digital image recording devices for real-time recording of images and/or video of the outside environment. The recording devices are often installed inside the vehicle, behind the windshield which in turn also acts as a protective shield. The recorded images are processed by ADAS depending on the desired functionality.

For example, for night driving assistance, an infrared camera records a video of the outside environment which is then displayed in real time on the dashboard of the vehicle. For autonomous driving or emergency braking, a camera records images and/or video which may be processed through computer vision methods, e.g. objects detection and classification algorithms, to extract relevant data which are thereafter fed to an automatic control unit to launch specific tasks.

High quality images and/or videos from ADAS recording devices are mandatory for an optimal operation of ADAS. As an illustrative example, ADAS may comprise object detection and classification algorithms which are able to real-time detect and classify objects of the surrounding environment of a vehicle by a real-time processing of recorded videos/images. As these algorithms may compute the position, the distance and/or the velocity of objects in relation to the car position, they may be sensitive to colours, light intensity and light deviation of the recorded images/videos to estimate, for instance, a risk of a collision. Any artefacts in the images/videos may cause wrong detection and/or classification and/or estimation of the distance, position or velocity of the objects, and may lead to defective operations of ADAS and safety failures.

It is then a strong requirement that the optical path of ADAS is free from optical distortions which may degrade the quality of the recorded images or/videos. In this scope, lot of efforts has been made and is still being made to improve the optical quality of windshields, since they are key components in the optical system of ADAS and have a key role in their overall performances.

Besides, windshields, as efficient as they could be, still remain optical systems in themselves with their own optical properties and limitations. Calibrating tools for ADAS have then been developed which try to evaluate and manage the effects of windshield on recorded images and/or videos by ADAS.

EP 3 293 701 B1 describes a calibration method for ADAS to compensate the optical distortions from windshields. Optical distortions are calculated from the comparison of recorded images of a planar checkerboard pattern through and out a reference windshield. Only static parameters are corrected, i.e. parameters that are considered to be the same for all windshields of a given category of product and, once corrected, are corrected also for all unmeasured windshields of same category. The static parameters are limited to tilt angle, refractive index or thickness of the pane.

In this method, intrinsic non static optical properties of each individual windshield are completely overlooked, which may cause inefficient calibration in long term use, in particular if a windshield departs too much from the reference windshield regarding optical distortions. Indeed, windshields of same kind often show some variations in their respective distribution of optical properties owing to the normal tolerances of the manufacturing process, either because they come from different manufacturing lines or, within the same manufacturing line, because of normal tolerances on the bending process, inhomogeneity of the furnace temperatures, defects during lamination, coating if present . . .

Within the same class or kind, the distribution of optical properties is different from a windshield to another and, therefore, these optical properties are by definition non static, which means that they cannot be considered as identical for all windshields of that class or kind. In this regard, each windshield has to be considered as an optical system in itself, different from the others, and its intrinsic optical properties have not to be neglected.

FR 3 032 820 A1 describes a calibration method for an ADAS to compensate the optical distortions from the windshield in front of which it is installed. Correction parameters are calculated while the car is driving from the deviations between measured positions of a static object from recorded images of said object through the windshield and predicted positions for said object.

The method shows several disadvantages. It has to be performed once the ADAS is already installed or in use on the vehicle and while the vehicle is driving. This can be hardly implemented in a production line. A system for calibrating the ADAS, comprising both the calibration device to perform the method and the facilities to record images of the road, has to be available on the operation place, which may become tedious and expensive in an industrial context.

As an alternative, WO 2020164841 A1 provides a computer implemented method to form training datasets containing simulated images viewed through a windshield which can be later fed to an ADAS for calibration or be used for windshield qualification. In the method, the effect of different windshields is simulated by an optical filter applied on the images of a dataset.

Using an optical filter to simulate the effect of windshield is not always an appropriate strategy to accurately simulate the effect of certain optical particularities. In particular, as a homogeneous filter, it cannot account for variation of said optical power along the windshield. Since the optical filter is used as a static filter, the effect of the intrinsic optical properties of each individual windshield is overlooked, with the same drawbacks mentioned above.

In the ADAS field, in particular because the effect of windshield is often overlooked during calibration and/or the windshield is falsely considered as a negligible component, it is also a common practice to require optical specifications for windshields which may be hard to fulfil in the future, in particular regarding the optical power in the view zone of the digital image recording devices. In this scope, anticipating this technical limitation by a better considering the particularities of windshield during ADAS calibration may be very valuable.

SUMMARY OF THE INVENTION

Technical Problem

There is a need for a method which solves all the afore mentioned problems. In particular, there is a need for a method for simulating the effects of distortions of a windshield on the image recording quality of a digital image recording device, which accounts accurately for the intrinsic optical particularities of each windshield considered individually, is able to provide valuable information of said effects for calibrating an ADAS without requiring cumbersome calibrating systems.

This method should be compatible with production/manufacturing throughputs in windshields and/or automotive industry, by facilitating its implementation and/or by providing output results in a relatively short time. In particular, it should not demand for high computing and data storage resources as such resources are often expensive and/or not available on-site at manufacturing facilities.

Further, the method should be able to simulate the effects of distortions of a windshield on the image recording quality of a digital image recording device in short time delay in order to allow its implementation in real-time applications, in particular for on-board systems.

Solution to the Technical Problem

The present disclosure relates to a method for simulating the effects of the optical distortions of a windshield on the image recording quality of a digital image recording device, as described in claims.

The method according to the disclosure is based on a combination of an adapted stochastic ray tracing method and of an adapted machine learning method to simulate the effects of the optical distortions of a windshield on the image recording quality of a digital image recording device. The simulation is performed from a measured optical quality function of the windshields related to those optical distortions and an image, in particular an image of a landscape likely to be recorded by a digital image recording device.

Accordingly, a first aspect of the disclosure relates to a first computer implemented method for generating a dataset of images with simulated effects of optical distortions of a windshield on the image recording quality of a digital image recording device. This first method implements an adapted stochastic ray tracing method for generating said dataset.

Accordingly, a second aspect of the disclosure relates to a second computer implemented method for simulating the effects of the optical distortions of a windshield on the image recording quality of a digital image recording device. This second method implements a convolutional artificial neural network which is trained with dataset of images generated by the first method, which in turn is able to provide, in a relatively short time, from an image of a landscape provided as input, a corresponding simulated image as viewed through said windshield taking into account its intrinsic optical particularities.

It is worth to mention that the first and second methods are to be considered as technically interrelated, at least because both are technically linked through the dataset of generated images which is respectively the output and input data of the former and latter methods.

Although as far as the first and second methods may be independently computer implemented or not, e.g. in two different computers program or in the same one, the aim of the invention, i.e. simulating the effects of the optical distortions of a windshield on the image recording quality of a digital image recording device, may not be achieved unless the technical link is maintained between the two methods, e.g. as a computing batch or computing pipeline, in which the dataset of generated images is output/input data.

In a third aspect of the disclosure the methods according to the first and second aspects may be used in a process for evaluating the optical quality of windshields for a use with a digital image recording device, in particular with a digital image recording device of an automated driving and advanced safety system. They may also be used in a process for calibrating digital image recording device of an automated driving and advanced safety system.

A fourth aspect of the disclosure relates to a data processing system and a computer program for carrying out the methods according to the first and second aspects of the invention.

A fifth aspect of the disclosure relates to a process for evaluating the performances of an object detection and classification algorithm of an automated driving and advanced safety system, in which set of simulated images of one or several images of landscapes as viewed through one or several windshields are fed to an object detection and classification algorithm of an automated driving and advanced safety system to monitor its performances in object detection and classification.

Advantages of the Invention

A first outstanding advantageous effect of the invention is that the intrinsic optical properties of the windshield, i.e. the optical properties of the windshield as an optical system in itself are not overlooked or neglected anymore, but are taken into account in their worth influence on the quality of recorded image, even when the optical quality of the windshields is deemed to fulfil requirements.

Comparing to methods of prior art, potential negative side-effects on image quality when a windshield departs too much from a reference windshield regarding optical distortions are completely eliminated.

A second advantage of the invention is that it does not rely on the computation of surrogate parameters, such as optical filters, to model the optical properties of the windshield. This kind of parameters are often limited in their application and not accurate enough for certain properties. Instead, the method of invention takes a measured quality function as a basis for the simulation and relies on the laws of optics, so that the accuracy and reliability of the simulated images are greatly improved.

Preferably, the measured quality function of the windshield which is related to the optical distortions of said windshield come from real-time measurements performed on production line of windshields. A measuring device may be at some location on the production line and configured to measure or collect data related to the quality function on the fly, on each windshield being produced. This approach is highly valuable as it is compatible with most common production throughputs and does not require later measurement on batches of already produced windshields, which is a time-consuming and tedious operation. The measured quality functions of the windshields can be stored in a database for later processing with a method according to the invention.

In the context of the disclosure, the images may be of any kind, e.g. images of landscapes, patterned boards or images such as checkerboard, doted board, fringe pattern . . . . The images may be recorded or a simulated 2D or 3D images.

In case of landscapes, the images may be recorded or a simulated 2D or 3D images of a 2D or a 3D real or simulated landscape. Preferably, it's a 2D image of landscape as they may require less computing resources for similar results compared to 3D images.

It is worth to mention that, in the context of the disclosure, an image of landscape has to be understood as a representative image of a representative landscape which is likely to be recorded by a digital image recording device, in particular a digital image recording device of an automated driving and advanced safety system, through a windshield.

Because it is based on the use of images, another advantage of the invention compared to prior art is that the need of cumbersome material calibration systems to evaluate the effects of windshields on recorded image of a material landscape or board by an ADAS, is alleviated, and even eliminated. Furthermore, the versatility in the choice of the image is greatly improved as it does not require to adapt and/or transform the existing material landscape or board to get a new one.

Another outstanding advantage of the invention is that it does not require the calculation of the global illuminance with a stochastic ray tracing method, and thereafter the computation of the 3D projection of said global luminance from the view frustum of a virtual camera for each input image for which the effects of optical distortion of a windshield is to be simulated.

Instead, the synergic combination of the adapted stochastic ray tracing method and of the adapted machine learning method allows a clever and accurate extraction of relevant features of the optical distortions of windshields, the effect of which on an image may be afterwards quickly simulated by providing said image to the machine learning method without further need to use the stochastic ray tracing method.

In other words, the invention does not require high computing and data storage resources, and it is therefore an aspect of the invention to provide a trained machine learning method which is able to simulate accurately the effect of optical distortion of windshield in relatively short time comparing to a method which is only based on ray tracing. This saves costs and is more compatible with industrial production/manufacturing throughputs.

A correlative advantage is that the invention may be easily implemented in real-time applications, in particular for on-board system, where the effects of the distortions of a windshield may have to be simulated on the fly, e.g. when a method according to the second aspect of the invention is directly implement in an ADAS and executed during the operation thereof in driving mode.

Another advantage of the invention is that it allows to accurately simulate batches or sets images as viewed by a digital image recording device through windshields of a set or batches of windshields without requiring inaccurate approximations of the optical properties of windshields regarding their potential optical distortions and side-effects on quality of recorded images.

As consequence, it can be advantageously used to evaluate the optical quality of windshields for applications in automated driving and advanced safety system, to calibrate digital image recording device of such system or to evaluate the performances of an object detection and classification algorithm of such system, as described in certain embodiments of the invention.

DETAILED DESCRIPTION OF EMBODIMENTS

Figure 1:
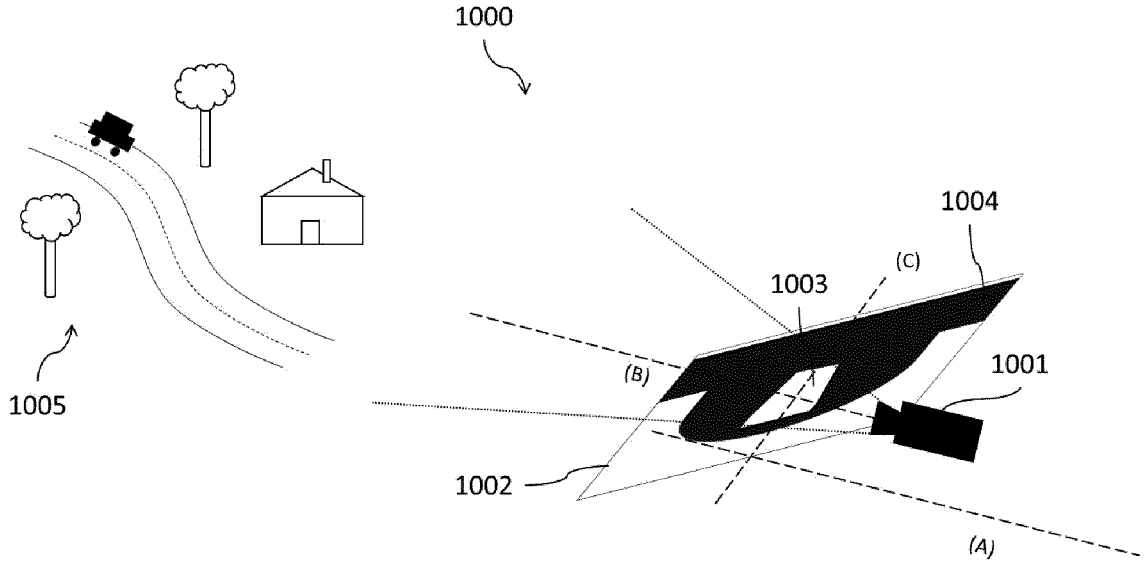
FIG. 1 is a schematic representation of the common installation of an advanced/automated driver-assistance system in a transport vehicle.

With reference to [FIG. 1], in most common installation 1000 of an ADAS in a transport vehicle, the ADAS comprises a digital image recording device 1001 located behind a demarcated view zone 1003 of the windshield 1002 of a vehicle. The digital image recording device 1001 is configured to real-time record or acquire images/videos of the landscape 1005 of surrounding environment of the vehicle. These images/videos are fed to the processing devices of the ADAS for object detection and classification, e.g. cars, roads, trees, people, houses . . . . They may be also directly displayed, e.g. on a screen, to the driver to help him to perform some manoeuvres.

On the windshield 1002, the view zone 1003 through which the digital image recording device 1001 is recording images/videos is usually demarcated by glaze or enamel stripes that are used as ornament and/or for concealing some elements such as fixing joints and electronics.

The inclination angle between the median axis (C) of the demarcated zone 1003 and the optical axis (B) of the digital image recording device 1001 may be equal to or may differ from the inclination angle between the median axis (C) of the demarcated zone 1003 and the median axis (A) of the vehicle chassis, which generally is horizontal. In most transport vehicles, the windshield 1002 is not vertical but inclined at a certain angle which is the installation angle of the windshield 1002 on the vehicle frame. In other words, with respect to the digital image recording device 1001, the windshield 1002 is inclined at an angle which corresponds to its condition of use.

In this configuration, the quality of the recorded images or/videos may partly depend on the optical quality of the demarcated view zone 1003 of the windshield 1001. In particular, the windshield 1002 must be devoid of optical distortions. However, as efficient as they could be, windshields still remain optical systems in themselves with their own optical properties and limitations, and their effects on the recorded images/videos remain to be evaluated for each of them.

Furthermore, as a windshield 1002 is often inclined with respect to the digital image recording device 1001, the distance between the surface of its demarcated view zone 1003 and the lens of the digital image recording device 1001, in one hand, and the length travelled by light ray inside the windshield 1002 itself, in other hand, vary vertically, i.e. along the (C) axis. Because the optical path length is not constant along this axis, further optical distortions, and/or deflections, may occur which have also to be considered while evaluating the effects of windshields on the image/video quality.

With reference to [FIG. 1] to 3, in a first aspect of the disclosure, there is provided a computer implemented method 3000 for generating a dataset of images with simulated effects of optical distortions of a windshield 1002 on the image recording quality of a digital image recording device, wherein said method 3000 takes as input a measured optical quality function 13001 related to the optical distortions of the windshield 1002 and a first dataset D3001 of images, wherein said method 3000 provides as output a second dataset D3002 of simulated images as viewed through said windshield 1002, wherein said method 3000 comprises the following steps:

(a) modelling 53002 at least one sheet 2002 of transparent mineral glass comprising two main parallel faces 2002a, 2002b, wherein the surface of at least one of said two main faces 2002a, 2002b is textured with the measured quality function 13001, and wherein the sheet 2002 of mineral glass is placed in front of an image 2001 and is inclined, in respect to said image 2001, with an installation angle (AÔC) of said windshield 1002 in a transporting vehicle, wherein said image 2001 is selected from the first dataset D3001;

(b) calculating 53002 with a stochastic ray tracing method, the global illuminance GI arriving through the modelled inclined sheet 2002 of mineral glass from the image 2001 used as a light source 2003;

(c) computing 53003 the 3D projection O3001 of the global illuminance GI from the view frustum 2004f of a virtual camera 2004 with an optical camera model OCM, wherein said virtual camera (2004) is placed in front of the opposite main face 2002b of the sheet 2002 of transparent mineral glass with respect to the image 3001 used as a light source 2003 and at a position corresponding to an installation position of the digital image recording device 1001;

(d) reiterating 53004 steps (a) to (d) for each image 2001 of the first dataset D3001 so that to generate a second dataset D3002 of simulated images, wherein said simulated images are the 3D projections O3001 computed at step (c).

In the field of ray tracing, 'global illumination' is a well-defined expression. It encompasses all kinds of illumination, whether direct or indirect, coming from a light source, i.e. the image 2001 in the present invention. Direct light is the light coming directly form the light source and indirect light is the reflected, refracted and/or diffused light from surfaces and/or volumes in the scene.

The frustum 2004f of the virtual camera 2004 corresponds to the field of view of said camera 2004 in the ray tracing scene. It is usually represented as a kind of pyramid of vision which is considered representative of the field of view of a real camera. Concretely, it constitutes the region of the ray tracing scene which may appear on the screen. 'Frustum' is well-defined term in the art.

In the context of the disclosure, optical distortions are to be understood as encompassing all the optical aberrations of the windshield which may affect the optical path of light so that the magnification varies across the field of view of said windshield at a given working distance. In other words, optical distortions are all aberrations which induces deviation from rectilinear projection in which straight lines remain straight across the field of view. At some extent, optical distortions may also comprise blur as long as it comes from the optical particularities of the windshield itself. Optical distortions may come from variations in refractive index, in surface roughness/profile, or in thickness of the windshield. They may also occur from defects.

As already mentioned, the measured optical quality function 13001 of the windshield 1002 may come from real-time measurements performed on production line of windshields. In this context, it may be the measured transmitted wavefront error of the windshield, the measured surfaces profiles and/or the measured distribution of complex refractive index.

In a preferred embodiment, the optical quality function 13001 related to the optical distortions is the measured transmitted wavefront error. An advantage is that the measurement of the transmitted wavefront error may be easily implemented on production lines of windshields as it may be performed quickly, with acquisition rates which may be compatible with throughputs of most production lines.

Object detection and classification algorithms implemented in data processing systems of ADAS may be often sensitive to colours, i.e. light wavelengths, and may perform better in colour filtered, for instance red or green filtered image. On the other hand, colour filtering may help to reduce image artefacts or anomalies, in particular for night-time images.

Furthermore, digital image recording devices may sometimes comprise colour filter array on some pixels. The image 2001 may then advantageously undergo some prior image processing in order to improve the image quality and/or extract wavelength specific information from said image and/or to render the effect of colour filter arrays.

In certain advantageous embodiments, before step (a), the image 2001 of the dataset D3001 may be digitally preprocessed, first with a colour filter array, for instance a clear-red-clear-clear or a clear-clear-red-clear filter array, and/or, second, with a demosaicing algorithm, in particular with a nearest-neighbour interpolation kernel.

At step (a), at least one of the faces of the modelled sheet 2002 of transparent mineral glass is textured with the measured quality function 13001. The texture of the textured surface may be modelled in different ways. For instance, it may be modelled with a bump map or a displacement map which is representative of the measured optical quality function.

At step (b), the global illuminance GI is calculated with a stochastic ray tracing method. Compared to conventional, i.e. non-stochastic, ray tracing methods, which rely on a given number of light rays to be drawn for each pixel, stochastic ray tracing methods allow to focus calculation on light rays reaching the virtual camera and not to those light rays going nowhere. Thus, they require less computer resource and computing time.

In the context of the disclosure, besides these advantages, using a stochastic ray tracing method may also allow to get the same level of accuracy as with conventional ray tracing methods. Monte Carlo ray tracing methods, in particular Metropolis Light Transport ray tracing methods, may provide valuable results.

Different stochastic ray tracing methods are available in the art. Any of them may be used at step (b) providing it is adapted to calculate the global illuminance GI arriving through the modelled inclined sheet of mineral glass. In particular, a stochastic path tracing method may be used, as it allows to get a high level of precision and sharpness.

Several physically based rendering engines are available in the art to implement stochastic ray tracing in step (b). Examples of engines are Indigo renderer or Lux-CoreRender.

According to the disclosure, the 3D projection O3001 of the global illuminance GI is performed with an optical camera model OCM. Preferably, the optical camera model OCM may be a physically realistic camera projection matrix. Alternatively, any other relevant quantity representative of the imaging operation, i.e. operation which converts simulated lights into colour values in a given colour space, e.g. RGB or XYZ, performed by the camera may be used, e.g. a point-spread function PSF, an optical transfer function OTF or a real modelling of each interface of the different optics of the camera lens (optical design) of the digital image recording device 1001.

Ideally, the optical camera model OCM used to model the virtual camera 2004 may be the camera projection matrix, the optical transfer function, the point-spread function, the optical design or the like, of the digital recording device 1001. However, in most cases, such models of the digital recording device may be not available or difficult to obtain. Nevertheless, accurate projection may still be obtained by considering the virtual camera as an ideal thin lens and using with a camera projection matrix of an ideal thin lens as a camera model.

In certain embodiments, the optical camera model OCM may be the measured or the simulated optical transfer function of the digital image recording device 1001. A direct advantage may be that the 3D projection may be closer to the 3D projection performed by the digital image recording device and more accurate for digital image recording device with specific optics.

Figure 2:
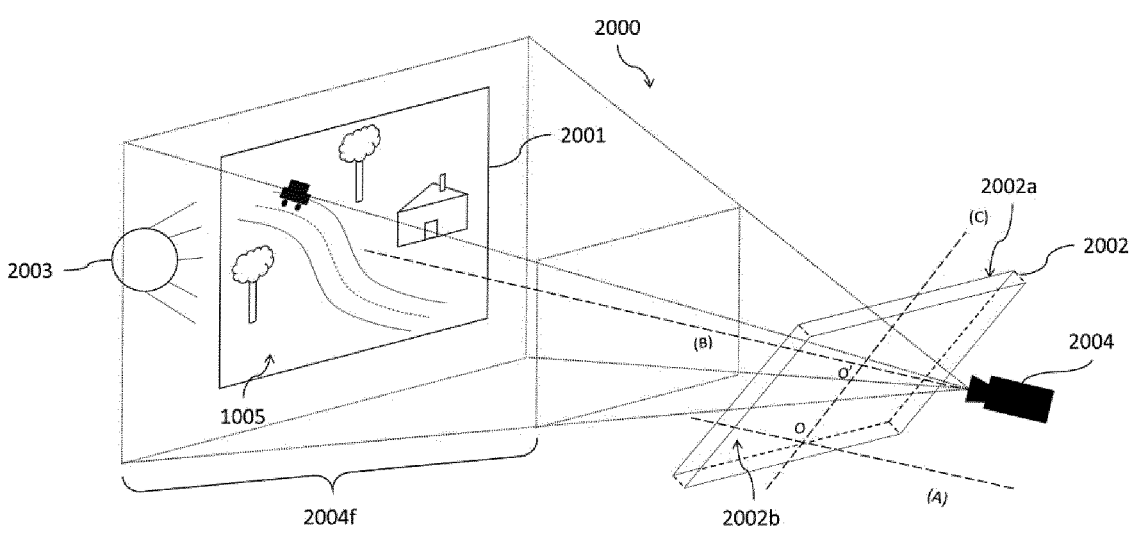
FIG. 2 is a schematic representation of an example of a scene for ray tracing for a method according to the invention.
Figure 3:
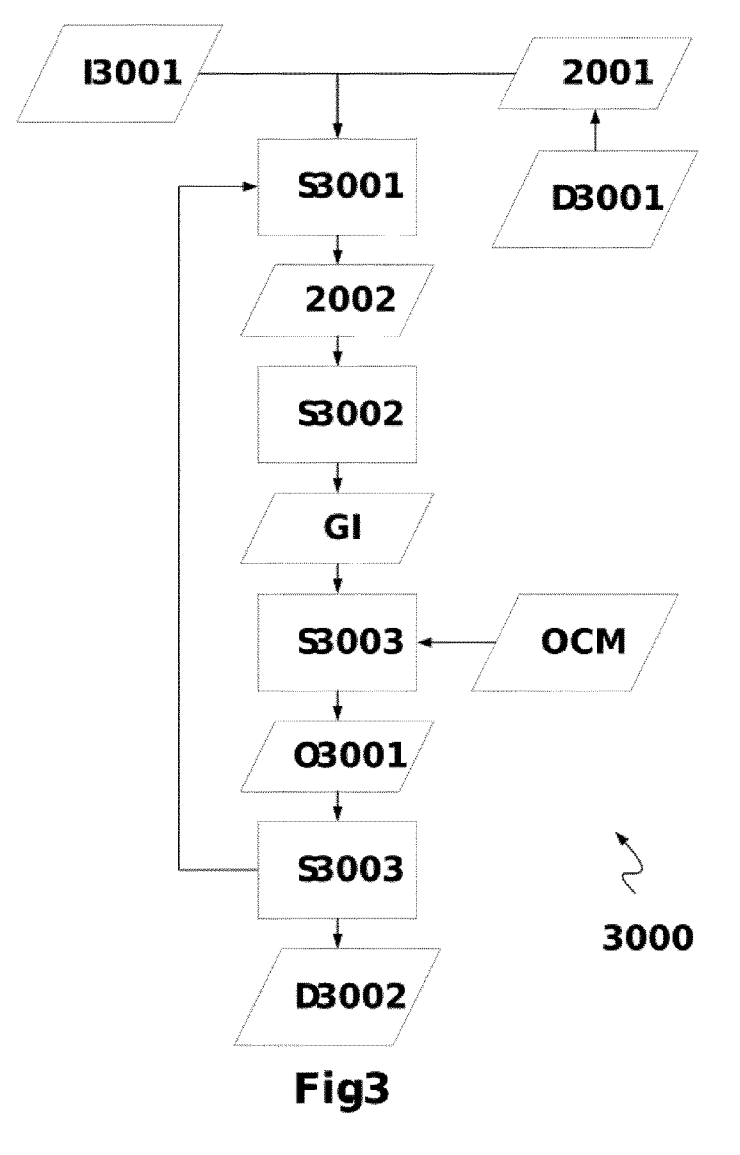
FIG. 3 is a logical data flow diagram of a method according to a first aspect of the disclosure.

On [FIG. 2], the image 2001 of the first dataset D3001 is at a finite distance of the modelled sheet 2002 of transparent mineral glass. In particular, the input image 2001 as a textured light source 2003 may be in the view frustum 2004$f$ of said virtual camera 2004.

In this embodiment, the landscape 1005 of the image 2001 may represent a more realistic configuration in respect to what a digital image recording device from an ADAS may acquire, or view, from a real landscape. In particular, distance-dependent effects can be taken into account. The output image O3001 may thus be more representative of real conditions.

However, the calculation of the global illumination GI may require more computational resources as the paths of light rays coming from the image 2001 used as light source are not parallel.

Figure 4:
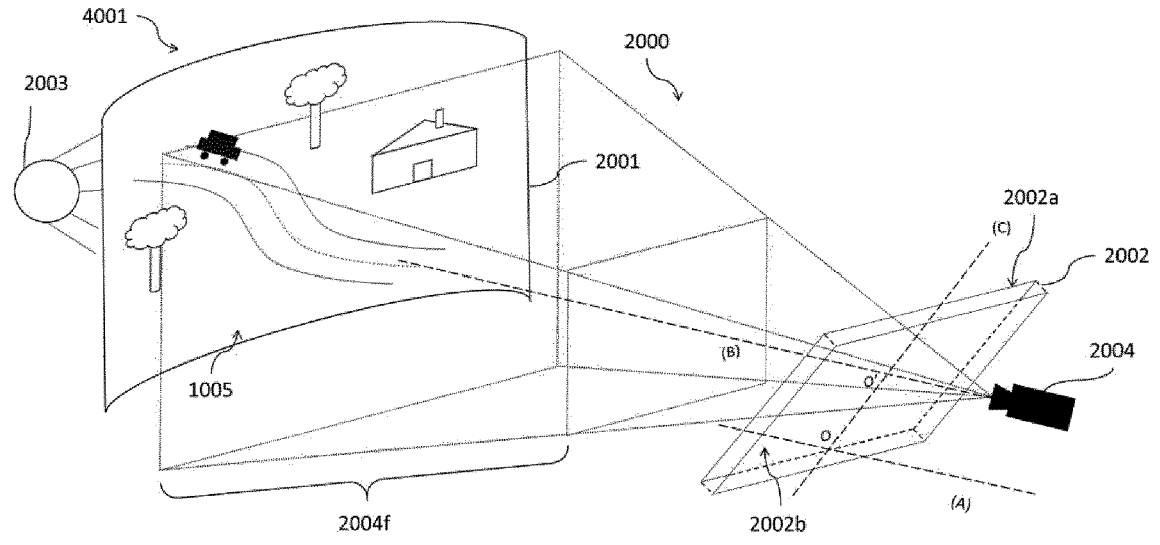
FIG. 4 is a schematic representation of an example embodiment of a scene for ray tracing for a method according to the first aspect of the disclosure.

Alternatively, according to a certain embodiment, with reference to [FIG. 4], the input image 2001 of the first dataset D3001 is digitally preprocessed as an environment map 4001 projected onto the inside surface of an environment sphere centered on the virtual camera 2004.

In the context of the disclosure, an environment map is a map projected on the scene coordinate system in order to make it the background of the scene in a ray tracing method. The environment map converts pixel locations in an image into angles of incidence. This makes any object to appear at an infinite location.

In this embodiment, the image 2001 of the dataset D3001 may be projected on the all or part of the inside surface of the environment sphere with spherical mapping technique, so that the image 2001 used as light source 2003 corresponds to an infinitely distant illumination which is afterwards refracted, reflected and/or diffused on the modelled sheet of transparent mineral glass 2002.

Main advantage may be that the light rays coming from each pixel of the image 2001 used as a light source 2003 form a rectilinear and parallel beam from an angular direction, as if the image was located at infinite distance. The computing workload may be alleviated and the computing time may be reduced without prejudicing the accuracy of the output image O3001.

Placing the image 2001 of the landscape 1005 at finite or infinite distance in the scene of ray tracing is a matter of choice and will depend on the specifications of both the digital image recording device and the ADAS.

At step (a), the modelled sheet 2002 of transparent mineral glass may represent the whole surface of the windshield 1002, and the surface of the at least one of two main faces 2002$a$, 2002$b$ of said modelled sheet 2002 may be textured with the measured quality function 13001 of the whole surface of said windshield 1002.

In certain embodiments, in step (a), the sheet 2002 of transparent mineral glass is modelled so that said sheet 2002 of transparent mineral glass represents only the demarcated zone 1003 of the windshield 1002 in front of which a digital image recording device 1001 may be placed. The demarcated zone 1003 is the region of interest for the recording of images through the windshield 1002 by the digital image recording device 1001. Therefore, it may be advantageous regarding computing time and speed of simulation to model only this demarcated zone 1003.

Alternatively, in other embodiments, in step (a), the sheet 2002 of mineral glass is modelled so that the global illuminance GI calculated at step (b) is only the global luminance GI arriving through the part of modelled sheet 2002 of mineral glass which corresponds to a demarcated zone 1003 of the windshield 1002 through which a digital image recording device 1001 may record an image.

As an illustrative example, in step (a), the modelled sheet 2002 of transparent mineral glass may be modelled to represent the whole surface of the windshield 1002, and the surface of the at least one of two main faces 2002$a$, 2002$b$ of said modelled sheet 2002 may be textured with the measured optical 13001 quality function of the whole surface of said windshield 1002. The portion of the surface of the modelled sheet 2002 which does not correspond to the demarcated zone 1001 may then be blackened in order to prevent part of the light coming from the light source from going through that portion. The global illuminance GI calculated at step (c) is then global luminance (GI) arriving through the non-blackened portion of the surface which corresponds to the demarcated zone 1003.

In certain embodiments, in step (a), a second sheet of transparent mineral glass and a polymeric interlayer may be modelled so that the first and second sheets of transparent mineral glass are assembled to each other by the polymeric interlayer, for instance a PVB interlayer, to form a laminated glazing, such as a windshield. The optical quality function 13001 of the windshield 1002 may then the measured optical quality function of the windshield or a calculated combination of measured optical quality functions of each sheet of transparent mineral glass and the polymeric interlayer.

Figures 5, 6:
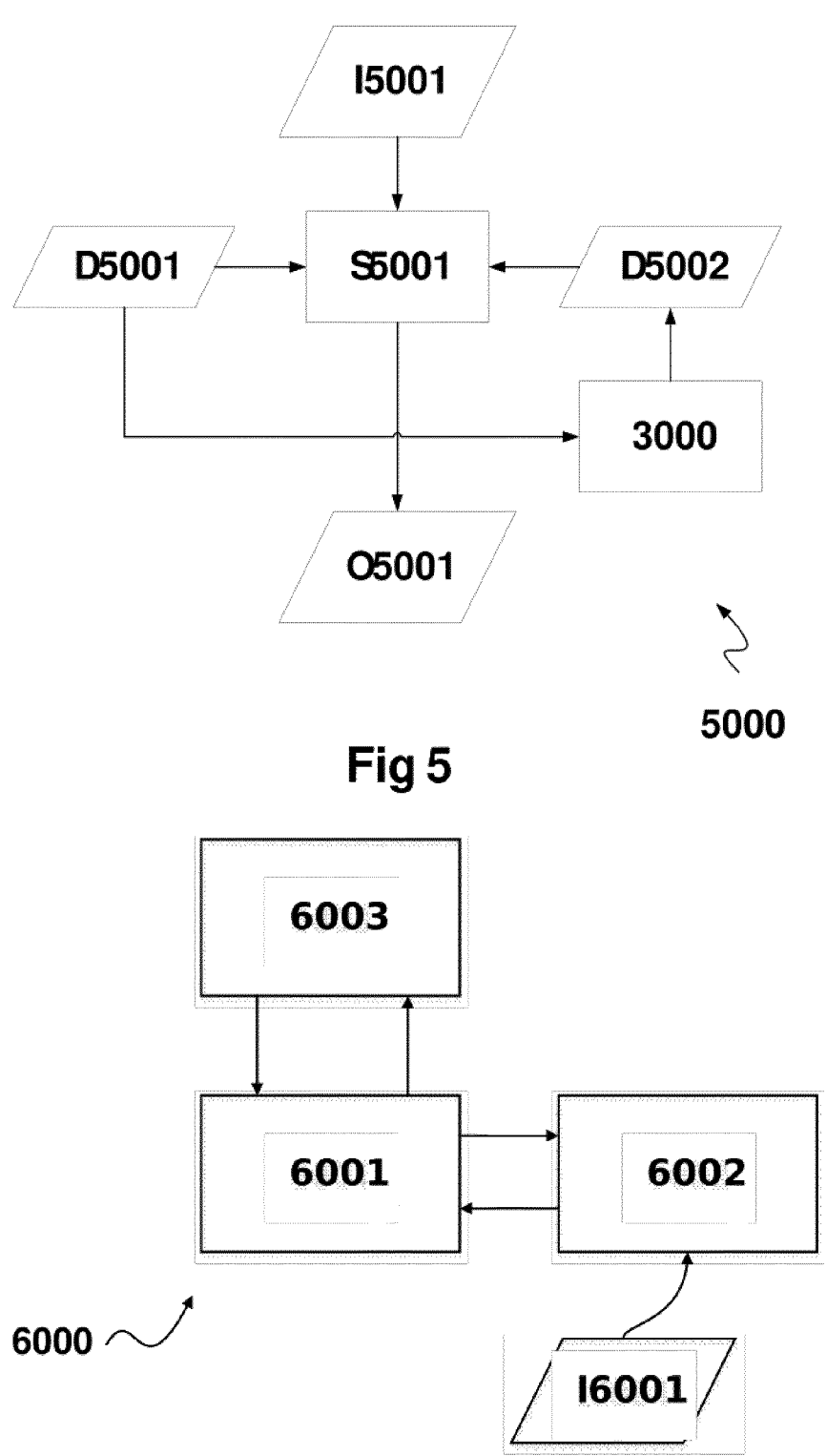
FIG. 5 is a logical data flow diagram of a method according to a second aspect of the disclosure
FIG. 6 is a physical data flow diagram of a processing data system to implement a method according to the first and/or second aspect of the disclosure.

With reference to [FIG. 5], in a second aspect of the disclosure, there is provided a computer implemented method 5000 for simulating the effects of the optical distortions of a windshield 1002 on the image recording quality of a digital image recording device 1001, wherein said method 5000 takes as input an image I5001 of a landscape 1005 likely to be recorded by a digital image recording device 1001 through said windshield 1002, wherein said method 5000 provides as output an image O5001 of said input image I5001 of a landscape as viewed through said windshield 1002, wherein said method 5000 comprises a step S5001 of computing with a trained convolutional artificial neural network an output image O5001 from the input image I5001, wherein said trained convolutional artificial neural network is previously trained with a training input dataset D5001 comprising images of one or several landscapes 1005 likely to be recorded by a digital image recording device 1001 through said windshield 1002 and a training target dataset D5002 comprising simulated images of said one or several landscapes 1005 as viewed through said windshield 1002, wherein said training target dataset D5002 is generated with a computer implemented method according to any embodiments of the first aspect of the disclosure from said training input dataset D5001.

Convolutional neural networks are well-known in the art. A convolutional neural network is a neural network comprising an input layer, an output layer and multiple hidden layers between the input and output layers. It comprises non-linear stacked layers, possibly fully connected non-linear staked layers, of neurons performing convolution operations on input data with convolution kernels of a given sizes to produce features maps. It may also comprise linear and/or non-linear dense layers, i.e. non convolutional layers, activation layers, down sampling layers, e.g. pooling layers, and standardization layers, e.g. batch normalization layers.

In certain embodiments, the convolutional artificial neural network may be based on a generator model, e.g. U-Net generator model, or a generative adversarial network architecture, e.g. Pix2Pix architecture.

Generative adversarial networks are neural network which are used for image generation. Generally, a generative adversarial network comprises a generator model part which is trained for generating images and a discriminator model part which is trained to classify images as real or fakes. The generator model part is trained to fool the discriminator model part. A generative adversarial network is considered trained when the discriminator model part is completely fooled; Afterwards, only the trained generator model part is used for generating images.

It is worth to note that, for instance, a U-Net generator model may be used as the generator model part of a generative adversarial network.

In an embodiment, the trained convolutional artificial neural network may be a generative adversarial network, wherein the discriminator model part of said generative adversarial network is trained with the training input dataset D5001 of image as training input data and the training target dataset D5002 as training target data. Once trained, the generator can then feed with the input image I5001 to simulate the output image O5001.

In the context of the disclosure, an advantage in using generative adversarial network is, as the generator model part is trained to fool the discriminator model part, the simulation of the optical distortions may show a high level of accuracy and realism.

In certain advantageous embodiments, the generator model part of said generative adversarial network may comprise an encoding convolutional artificial neural network which performs at least one downsampling operation on images provided as input, and a decoding convolutional artificial neural network which performs a at least upsampling operation on downsampled images from the encoding convolutional artificial neural network.

The number of downsampling/upsampling operations may depend on the size of the images. As an illustrative example, a series of height downsampling operations followed by a series of upsampling operations on a 8-bit colour 256×256 px image may provide advantageous performances for the modelling, i.e. simulation, of the optical distortions without requiring too much computing resources.

In certain embodiments, residual or skip connections between layers of neurons may be implemented in the neural networks. The main advantage of residual neural network is a reduction of overfitting and loss of information between successive layers of neurons. Rectified Linear Unit (ReLu) are often used as activation functions to introduce nonlinearities as means to reduce the vanishing gradient effect, then to increase learning speed and efficiency.

The first and second aspects of the disclosure are computer implemented. Accordingly, with reference to [FIG. 6], in a third aspect of the disclosure, there is provided a data processing system 6000 comprising means for carrying out a method according to any embodiments of the first aspect of the disclosure and/or a method according to any embodiments of the second aspect of the disclosure.

Example of means for carrying out the method is a device 6001 which can be instructed to carry out sequences of arithmetic or logical operations automatically to perform tasks or actions. Such device, also called computer, may comprise one or more Central Processing Unit (CPU) and at least a controller device that are adapted to perform those operations. It may further comprise other electronic components like input/output interfaces 6003, non-volatile or volatile storages devices 6003, and buses that are communication systems for the data transfer between components inside a computer, or between computers. One of the input/ output devices may be user interface for human-machine interaction, for example graphical user interface to display human understandable information.

As image processing and ray tracing may often require high computational power to process large amounts of data, the data processing system 6000 may advantageously comprise one or more Graphical Processing Units (GPU) whose parallel structure makes them more efficient than CPU, in particular for image processing in ray tracing.

Nevertheless, in the context of the disclosure, it is worth to mention that one objective is to provide a method which is able to simulate accurately the effect of optical distortion of windshield without requiring high computing and data storage resources for, in particular, real-time applications such as in on-board systems in which the effects of the distortions of a windshield may have to be simulated on the fly time implementations. Accordingly, this may be achieved by the method according to the second aspect of the disclosure as once the neural convolutional artificial neural network is trained, said method requires low computing resources and may be executed on low power computer board such as single-board computer.

A fourth aspect of the disclosure, there is provided a computer program I5001 comprising instructions which, when the program is executed by a computer, cause the computer to carry out a method according to any embodiments of the first aspect of the disclosure and/or a method according to any embodiments of the second aspect of the disclosure.

Any kind of programming language, either compiled or interpreted, can be used to implement the steps of the method of the invention. The computer program can be part of a software solution, i.e. part of a collection of executable instructions, code, scripts or the like and/or databases.

In certain embodiment, the computer program may be stored is on a computer-readable medium 6003. Accordingly, such computer-readable medium 6002 may comprise instructions which, when executed by a computer, cause the computer to carry out the method according to any of the embodiments described herein.

The computer-readable storage 6002 may be preferably a non-volatile storage or memory, for example hard disk drive or solid-state drive. The computer-readable storage can be removable storage media or a non-removable storage media as part of a computer.

Alternatively, the computer-readable storage 6002 may be a volatile memory inside a removable media. This can ease the deployment of the invention into many production sites.

The invention according to the first and second aspects of the disclosure is well adapted to be used in a process for evaluating the optical quality of windshields for a use with a digital image recording device, in particular with a digital image recording device of an automated driving and advanced safety system.

The effects of the optical distortions may then be simulated for each windshield of a batch of windshields from their respective measured quality function and a reference image of landscape or a set of reference images. Once the effects of the optical distortions are simulated, the windshields may be compared, and those less altering the image quality regarding required specifications may be selected for use with a digital image recording device.

Alternatively, some criteria may be defined on the simulated images or on the output of ADAS algorithms fed with the simulated images in order to reject non-compliant windshields.

The invention according to the first and second aspects of the disclosure may be as well adapted to be in a process for calibrating digital image recording device of an automated driving and advanced safety system.

For instance, the effects of optical distortions of a reference windshield or a windshield from a set of reference windshields, i.e. windshields whose optical quality is considered to fulfil requirements for a use with a digital image recording device, may be simulated from a set of images of landscapes. The output images may then be used to calibrate and/or select the relevant features of a digital image recording device.

Figure 7:
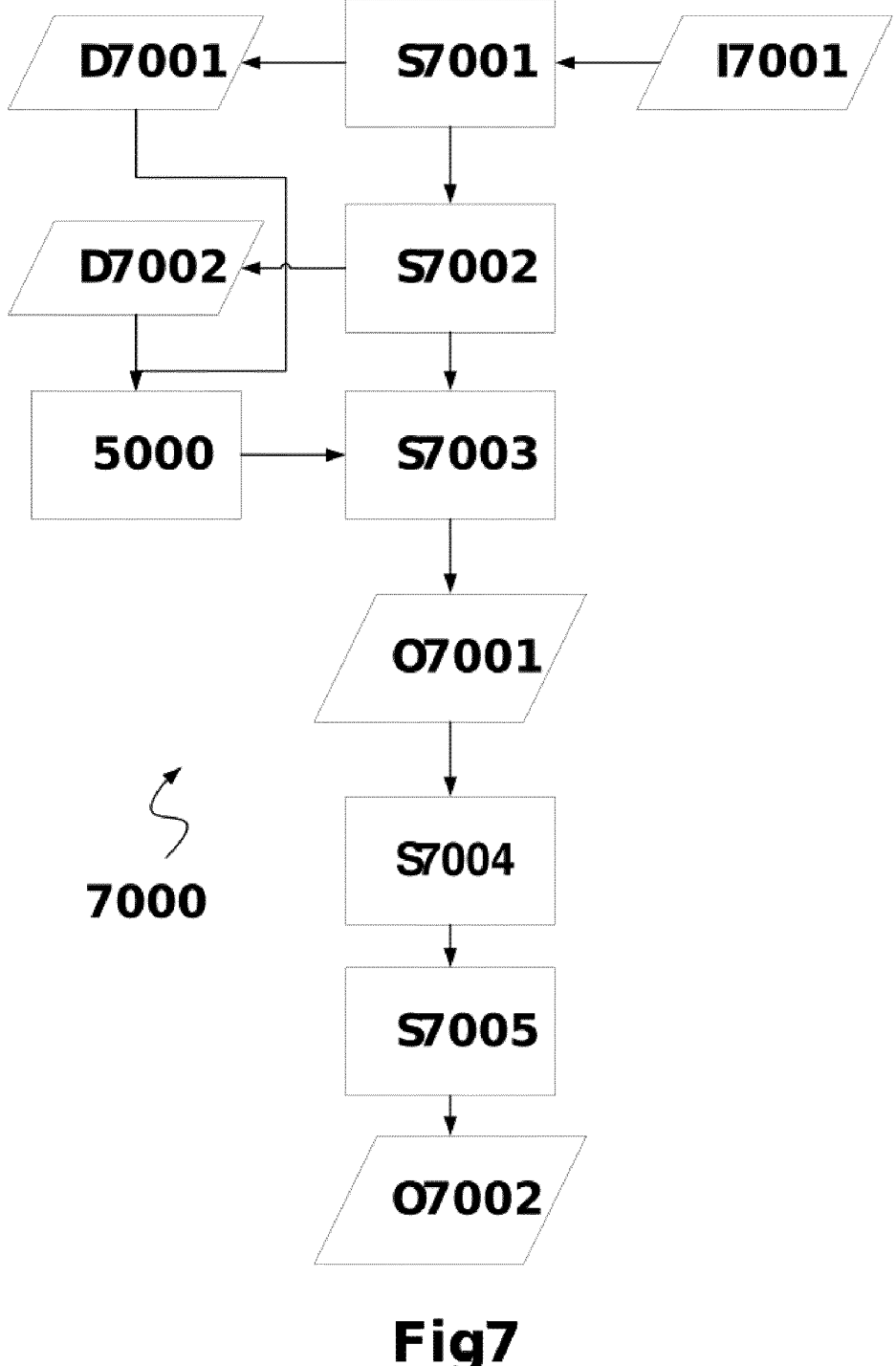
FIG. 7 is a logical data flow diagram of a method process for evaluating the performances of an object detection and classification algorithm of an automated driving and advanced safety system.

In this context, in a fifth aspect of the invention, with reference to [FIG. 7], there is provided [C16] a process 7000 for evaluating the performances of an object detection and classification algorithm of an automated driving and advanced safety system, wherein said process 7000 comprises the following steps:

(a) providing S7001 a set D7001 of measured optical quality functions related to the optical distortions of a set I7001 of windshields 1002;

(b) providing S7002 a set D7002 of images 2001 of landscapes 1005 likely to be recorded by a digital image recording device 1001 through the windshields 1002 of said set I7001 of windshields 1002;

(c) using S7003 a computer implemented method 5000 according to any of claims 10 to 12 for each image 2001 of the set of images 2001 of landscapes (1005) and each measured optical quality function of the set D7001 of measured optical quality functions in order to provide a set O7001 of images of the images 2001 of the set D7002 of images 2001 of landscapes 1005 as viewed through the windshield 1002 of said set of windshields 1002;

(d) feeding S7004 the set O7001 of images obtained at step (c) to an object detection and classification algorithm of an automated driving and advanced safety system;

(e) monitoring S7004 performance parameters O7002 in the object detection and classification of said algorithm while the algorithm is processing the set O7001 of images fed at step (d).

The invention claimed is:

1. A computer implemented method for generating a dataset of images with simulated effects of optical distortions of a windshield on an image recording quality of a digital image recording device, wherein said method takes as input a measured optical quality function related to the optical distortions of the windshield and a first dataset of images, wherein said method provides as output a second dataset of simulated images as viewed through said windshield, wherein said method comprises the following steps:

(a) modelling at least one sheet of transparent mineral glass comprising two main parallel faces, wherein a surface of at least one of said two main parallel faces is textured with the measured optical quality function, and wherein the sheet of transparent mineral glass is placed in front of an image and is inclined, in respect to said image, with an installation angle of said windshield in a transporting vehicle, wherein said image is selected from the first dataset;

(b) calculating, with a stochastic ray tracing method, a global illuminance arriving through the modelled inclined sheet of mineral glass from the image used as a light source;

(c) computing a 3D projection of the global illuminance from a view frustum of a virtual camera with an optical camera model, wherein said virtual camera is placed in front of an opposite main face of the sheet of transparent mineral glass with respect to the image used as a light source and at a position corresponding to an installation position of the digital image recording device, and (d) reiterating steps (a) to (d) for each image of the first dataset so that to generate the second dataset of simulated images, wherein said simulated images are the 3D projections computed at step (c).

2. The computer implemented method according to claim 1, wherein the measured optical quality function related to the optical distortions of the windshield is a measured transmitted wavefront error of the windshield, measured surfaces profiles and/or measured distribution of complex refractive index.

3. The computer implemented method according to claim 1, wherein the image of the first dataset is at a finite distance of the modelled sheet of mineral glass.

4. The computer implemented method according to claim 1, wherein the image of the first dataset is digitally preprocessed as an environment map projected onto an inside side of an environment sphere centered on the virtual camera.

5. The computer implemented method according to claim 1, wherein, in step (a), the sheet of transparent mineral glass is modeled so that said sheet of transparent mineral glass represents only a demarcated zone of the windshield in front of which a digital image recording device may be placed.

6. The computer implemented method according to claim 1, wherein, in step (a), the sheet of transparent mineral glass is modelled so that the global illuminance calculated at step (c) is only the global luminance arriving through the part of modelled sheet of transparent mineral glass which corresponds to a demarcated zone of the windshield through which a digital image recording device records an image.

7. The computer implemented method according to claim 1, wherein the optical camera model of the virtual camera is a camera projection matrix, a point-spread function, an optical transfer function or a real modelling of each interface of the different optics of the camera lens of the digital image recording device.

8. The computer implemented method according to claim 1, wherein, before step (a), the image of the dataset is digitally preprocessed first with a color filter array, and/or second with a demosaicing algorithm.

9. The computer implemented method according to claim 1, wherein the texture of the textured surface is modeled with a bump map or a displacement map.

10. A computer implemented method for simulating effects of optical distortions of a windshield on an image recording quality of a digital image recording device, wherein said method takes as input an image of a landscape to be recorded by a digital image recording device through said windshield, wherein said method provides as output an image of said input image of a landscape as viewed through said windshield, wherein said method comprises a step of computing with a trained convolutional artificial neural network an output image from the input image, wherein said trained convolutional artificial neural network is previously trained with a training input dataset comprising images of one or several landscapes to be recorded by a digital image recording device through said windshield and a training target dataset comprising simulated images of said one or several landscapes as viewed through said windshield, wherein said training target dataset is generated with the computer implemented method according to claim 1 from said training input dataset.

11. The computer implemented method according to claim 10, wherein the trained convolutional artificial neural network is a generative adversarial network, wherein the discriminator model part of said generative adversarial network is trained with the training input dataset of image as training input data and the training target dataset as training target data.

12. The computer implemented method according to claim 11, wherein the generator model part of said generative adversarial network comprises an encoding convolutional artificial neural network which performs at least downsampling operation on images provided as input, and a decoding convolutional artificial neural network which performs at least upsampling operation on dowsampled images from the encoding convolutional artificial neural network.

13. A data processing system comprising a processor and a memory coded with instructions, which when executed by the processor, carry out the method according to claim 1.

14. A non-transitory machine readable medium comprising instructions which, when the instructions are executed by a computer, causes the computer to carry out the method according to claim 1.

15. A process comprising evaluating the optical quality of windshields for a use with a digital image recording device using the method according to claim 10.

16. A process for evaluating performances of an object detection and classification algorithm of an automated driving and advanced safety system, wherein said process comprises the following steps:

(a) providing a set of measured optical quality functions related to optical distortions of a set of windshields;

(b) providing a set of images of landscapes to be recorded by a digital image recording device through the windshields of said set of windshields;

(c) using the computer implemented method according to claim 10 for each image of the set of images of landscapes and each measured optical quality function of the set of measured optical quality functions in order to provide a set of images of the images of the set of images of landscapes as viewed through the windshield of said set of windshields;

(d) feeding the set of images obtained at step (c) to an object detection and classification algorithm of an automated driving and advanced safety system, and (e) monitoring performance parameters in the object detection and classification of said algorithm while the algorithm is processing the set of images fed at step (d).

17. The computer implemented method according to claim 8, wherein the demosaicing algorithm is a nearest-neighbor interpolation kernel.

18. A data processing system comprising a processor and a memory coded with instructions, which when executed by the processor, carry out the method according to claim 10.

19. A non-transitory machine readable medium comprising instructions which, when the instructions are executed by a computer, causes the computer to carry out the method according to claim 10.

20. The process according to claim 15, wherein the digital image recording device is a digital image recording device of an automated driving and advanced safety system.

* * * * *